United States Patent
Takeno et al.

[11] Patent Number: 5,625,355
[45] Date of Patent: Apr. 29, 1997

[54] APPARATUS AND METHOD FOR DECODING VARIABLE-LENGTH CODE

[75] Inventors: Hiroshi Takeno, Kyoto; Eiji Miyagoshi, Osaka; Hiroshi Imanishi, Takatsuki; Shintarou Nakatani, Osaka; Toshihide Akiyama, Takatsuki, all of Japan

[73] Assignee: Matsushita Electric Industrial Co., Ltd., Kadoma, Japan

[21] Appl. No.: 379,900

[22] Filed: Jan. 27, 1995

[30] Foreign Application Priority Data

Jan. 28, 1994 [JP] Japan .................................. 6-008261

[51] Int. Cl.$^6$ .................................................. H03M 7/40
[52] U.S. Cl. .................................................. 341/67; 341/106
[58] Field of Search .................................. 341/55, 67, 106

[56] References Cited

U.S. PATENT DOCUMENTS

| | | | |
|---|---|---|---|
| 4,509,038 | 4/1985 | Hirano | 341/67 |
| 4,899,149 | 2/1990 | Kahan | 341/67 |
| 5,426,463 | 6/1995 | Reininger et al. | 348/405 |
| 5,428,356 | 6/1995 | Ozaki | 341/67 |
| 5,488,366 | 1/1996 | Wu | 341/67 |

OTHER PUBLICATIONS

M. Sun et al., "A Parallel Variable–Length–Code Decoder for Advanced Television Applications", *Third International Workshop on HDTV*, Sep. 1, 1989.

*Primary Examiner*—Marc S. Hoff
*Attorney, Agent, or Firm*—Ratner & Prestia

[57] ABSTRACT

A variable-length-code decoder of this invention decodes an input bit stream including an input bit string having a codeword of a fixed-length code and a plurality of codewords of variable-length codes combined in a predetermined format. The decoder includes: a shifter for shifting the input bit string by a desired number of bits; a pattern detector for detecting a specific pattern in the bit string, and outputting a detection signal; two code tables provided for the respective variable-length codes, each code table having the length of each codeword (codeword length) and the decoded-word corresponding to the codeword, and outputting a codeword length and a decoded-word of a corresponding codeword based on the bit string output from the shifter; a processor for storing the format of the input bit string, outputting the length of the fixed-length code and decoded data of the fixed-length code, and selecting, for each of the variable-length codewords, one of the code tables to which the variable-length codeword belongs, based on the detection signal and the format; a codelength selector for selecting the codeword length or the fixed-length code, and for setting the shift amount for the input bit string in the shifter; and an output circuit for selectively outputting the decoded-word or the decoded data.

22 Claims, 7 Drawing Sheets

FIG. 4

Table I

| Address (Codeword) | Codeword-length | Decoded-word |
|---|---|---|
| 0 0 0 0 0 0 | 0 1 0 | 0 0 0 0 0 0 0 0 0 0 0 0 0 0 0 1 |
| 0 0 0 0 0 1 | 0 1 0 | 0 0 0 0 0 0 0 0 0 0 0 0 0 0 0 1 |
| ⋮ | 0 1 0 | 0 0 0 0 0 0 0 0 0 0 0 0 0 0 0 1 |
| ⋮ | 0 1 0 | 0 0 0 0 0 0 0 0 0 0 0 0 0 0 0 1 |
| 0 0 1 1 1 1 | 0 1 0 | 0 0 0 0 0 0 0 0 0 0 0 0 0 0 0 1 |
| 0 1 0 0 0 0 | 0 1 0 | 0 0 0 0 0 0 0 0 0 0 0 0 0 0 1 0 |
| ⋮ | 0 1 0 | 0 0 0 0 0 0 0 0 0 0 0 0 0 0 1 0 |
| ⋮ | 0 1 0 | 0 0 0 0 0 0 0 0 0 0 0 0 0 0 1 0 |
| 0 1 1 1 1 1 | 0 1 0 | 0 0 0 0 0 0 0 0 0 0 0 0 0 0 1 0 |
| 1 0 0 0 0 0 | 0 1 1 | 0 0 0 0 0 0 0 0 0 0 0 0 0 0 0 0 |
| ⋮ | 0 1 1 | 0 0 0 0 0 0 0 0 0 0 0 0 0 0 0 0 |
| ⋮ | 0 1 1 | 0 0 0 0 0 0 0 0 0 0 0 0 0 0 0 0 |
| 1 0 0 1 1 1 | 0 1 1 | 0 0 0 0 0 0 0 0 0 0 0 0 0 0 0 0 |
| 1 0 1 0 0 0 | 0 1 1 | 0 0 0 0 0 0 0 0 0 0 0 0 0 0 1 1 |
| ⋮ | 0 1 1 | 0 0 0 0 0 0 0 0 0 0 0 0 0 0 1 1 |
| ⋮ | 0 1 1 | 0 0 0 0 0 0 0 0 0 0 0 0 0 0 1 1 |
| 1 0 1 1 1 1 | 0 1 1 | 0 0 0 0 0 0 0 0 0 0 0 0 0 0 1 1 |
| 1 1 0 0 0 0 | 0 1 1 | 0 0 0 0 0 0 0 0 0 0 0 0 1 0 0 |
| ⋮ | 0 1 1 | 0 0 0 0 0 0 0 0 0 0 0 0 1 0 0 |
| ⋮ | 0 1 1 | 0 0 0 0 0 0 0 0 0 0 0 0 1 0 0 |
| 1 1 0 1 1 1 | 0 1 1 | 0 0 0 0 0 0 0 0 0 0 0 0 1 0 0 |
| 1 1 1 0 0 0 | 1 0 0 | 0 0 0 0 0 0 0 0 0 0 0 0 1 0 1 |
| ⋮ | 1 0 0 | 0 0 0 0 0 0 0 0 0 0 0 0 1 0 1 |
| ⋮ | 1 0 0 | 0 0 0 0 0 0 0 0 0 0 0 0 1 0 1 |
| 1 1 1 0 1 1 | 1 0 0 | 0 0 0 0 0 0 0 0 0 0 0 0 1 0 1 |
| 1 1 1 1 0 0 | 1 0 1 | 0 0 0 0 0 0 0 0 0 0 0 0 1 1 0 |
| 1 1 1 1 0 1 | 1 0 1 | 0 0 0 0 0 0 0 0 0 0 0 0 1 1 0 |
| 1 1 1 1 1 0 | 1 1 0 | 0 0 0 0 0 0 0 0 0 0 0 1 1 1 |
| 1 1 1 1 1 1 | 0 0 0 | 0 0 0 0 0 1 1 1 1 1 1 1 1 1 1 1 |

FIG.5  Table II

| Address (Codeword) | Codeword-length | Decoded-word | |
|---|---|---|---|
| | | Runlength of "0" | Data-value |
| 0 0 0 0 0 0 | 0 0 0 | 1 1 1 1 1 1 | 1 1 1 1 1 1 1 1 1 1 1 1 |
| 0 0 0 0 0 1 | 0 0 0 | 1 1 1 1 1 1 | 1 1 1 1 1 1 1 1 1 1 1 1 |
| 0 0 0 0 1 0 | 0 0 0 | 1 1 1 1 1 1 | 1 1 1 1 1 1 1 1 1 1 1 1 |
| 0 0 0 0 1 1 | 0 0 0 | 1 1 1 1 1 1 | 1 1 1 1 1 1 1 1 1 1 1 1 |
| 0 0 0 1 0 0 | 0 0 0 | 1 1 1 1 1 1 | 1 1 1 1 1 1 1 1 1 1 1 1 |
| ⋮ | 0 0 0 | 1 1 1 1 1 1 | 1 1 1 1 1 1 1 1 1 1 1 1 |
| | 0 0 0 | 1 1 1 1 1 1 | 1 1 1 1 1 1 1 1 1 1 1 1 |
| 0 0 1 0 0 1 | 0 0 0 | 1 1 1 1 1 1 | 1 1 1 1 1 1 1 1 1 1 1 1 |
| 0 0 1 0 1 0 | 1 1 0 | 0 0 0 0 0 0 | 0 0 0 0 0 0 0 0 0 0 1 1 |
| 0 0 1 0 1 1 | 1 1 0 | 0 0 0 0 0 0 | 1 1 1 1 1 1 1 1 1 1 0 1 |
| 0 0 1 1 0 0 | 1 1 0 | 0 0 0 1 0 0 | 0 0 0 0 0 0 0 0 0 0 0 1 |
| 0 0 1 1 0 1 | 1 1 0 | 0 0 0 1 0 0 | 1 1 1 1 1 1 1 1 1 1 1 1 |
| 0 0 1 1 1 0 | 1 1 0 | 0 0 0 0 1 1 | 0 0 0 0 0 0 0 0 0 0 0 1 |
| 0 0 1 1 1 1 | 1 1 0 | 0 0 0 0 1 1 | 1 1 1 1 1 1 1 1 1 1 1 1 |
| 0 1 0 0 0 0 | 1 0 1 | 0 0 0 0 0 0 | 0 0 0 0 0 0 0 0 0 0 1 0 |
| 0 1 0 0 0 1 | 1 0 1 | 0 0 0 0 0 0 | 0 0 0 0 0 0 0 0 0 0 1 0 |
| 0 1 0 0 1 0 | 1 0 1 | 0 0 0 0 0 0 | 1 1 1 1 1 1 1 1 1 1 1 0 |
| 0 1 0 0 1 1 | 1 0 1 | 0 0 0 0 0 0 | 1 1 1 1 1 1 1 1 1 1 1 0 |
| 0 1 0 1 0 0 | 1 0 1 | 0 0 0 0 1 0 | 0 0 0 0 0 0 0 0 0 0 0 1 |
| 0 1 0 1 0 1 | 1 0 1 | 0 0 0 0 1 0 | 0 0 0 0 0 0 0 0 0 0 0 1 |
| 0 1 0 1 1 0 | 1 0 1 | 0 0 0 0 1 0 | 1 1 1 1 1 1 1 1 1 1 1 1 |
| 0 1 0 1 1 1 | 1 0 1 | 0 0 0 0 1 0 | 1 1 1 1 1 1 1 1 1 1 1 1 |
| 0 1 1 0 0 0 | 1 0 0 | 0 0 0 0 0 1 | 0 0 0 0 0 0 0 0 0 0 0 1 |
| ⋮ | 1 0 0 | 0 0 0 0 0 1 | 0 0 0 0 0 0 0 0 0 0 0 1 |
| | 1 0 0 | 0 0 0 0 0 1 | 0 0 0 0 0 0 0 0 0 0 0 1 |
| 0 1 1 0 1 1 | 1 0 0 | 0 0 0 0 0 1 | 0 0 0 0 0 0 0 0 0 0 0 1 |
| 0 1 1 1 0 0 | 1 0 0 | 0 0 0 0 0 1 | 1 1 1 1 1 1 1 1 1 1 1 1 |
| ⋮ | 1 0 0 | 0 0 0 0 0 1 | 1 1 1 1 1 1 1 1 1 1 1 1 |
| 0 1 1 1 1 1 | 1 0 0 | 0 0 0 0 0 1 | 1 1 1 1 1 1 1 1 1 1 1 1 |
| 1 0 0 0 0 0 | 0 1 0 | 0 0 0 0 0 0 | 0 0 0 0 0 0 0 0 0 0 0 0 |
| ⋮ | 0 1 0 | 0 0 0 0 0 0 | 0 0 0 0 0 0 0 0 0 0 0 0 |
| | 0 1 0 | 0 0 0 0 0 0 | 0 0 0 0 0 0 0 0 0 0 0 0 |
| 1 0 1 1 1 1 | 0 1 0 | 0 0 0 0 0 0 | 0 0 0 0 0 0 0 0 0 0 0 0 |
| 1 1 0 0 0 0 | 0 1 1 | 0 0 0 0 0 0 | 0 0 0 0 0 0 0 0 0 0 0 1 |
| ⋮ | 0 1 1 | 0 0 0 0 0 0 | 0 0 0 0 0 0 0 0 0 0 0 1 |
| | 0 1 1 | 0 0 0 0 0 0 | 0 0 0 0 0 0 0 0 0 0 0 1 |
| 1 1 0 1 1 1 | 0 1 1 | 0 0 0 0 0 0 | 0 0 0 0 0 0 0 0 0 0 0 1 |
| 1 1 1 0 0 0 | 0 1 1 | 0 0 0 0 0 0 | 1 1 1 1 1 1 1 1 1 1 1 1 |
| ⋮ | 0 1 1 | 0 0 0 0 0 0 | 1 1 1 1 1 1 1 1 1 1 1 1 |
| 1 1 1 1 1 1 | 0 1 1 | 0 0 0 0 0 0 | 1 1 1 1 1 1 1 1 1 1 1 1 |

50 = Address (Codeword); 51 = Codeword-length; 52 = Decoded-word

EOB corresponds to rows 1 0 0 0 0 0 through 1 0 1 1 1 1

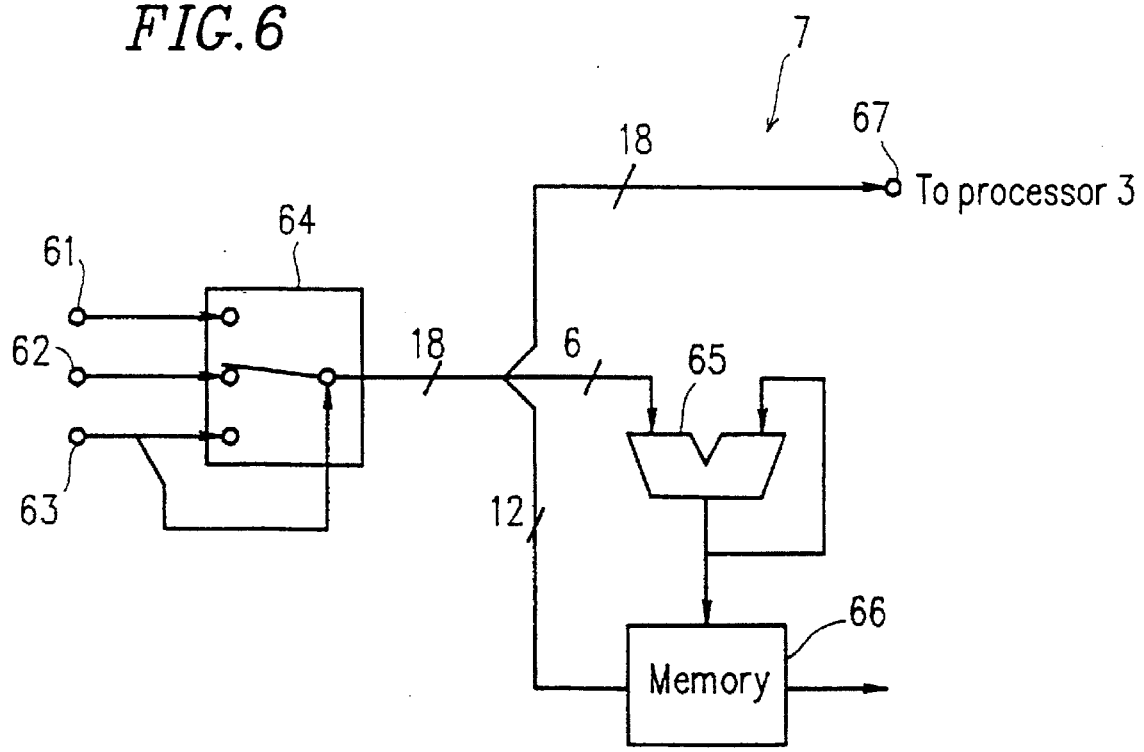

APPARATUS AND METHOD FOR DECODING VARIABLE-LENGTH CODE

BACKGROUND OF THE INVENTION

1. Field of the Invention

The present invention relates to an apparatus and a method for decoding compressed and coded data. More particularly, the present invention relates to an apparatus and a method for decoding a bit string which is obtained by compressing and coding a moving-picture video signal by a variable-length code.

2. Description of the Related Art

In recent years, as image data compression techniques for video images, an interframe motion compensation coding, a variable-length coding, and a composite coding in which these coding techniques are combined have been developed. When data has been coded in accordance with such a coding technique, and transmitted and/or recorded, a variable-length-code decoder which can perform its processing at a high bit rate and can cope with errors is required for decoding and reproducing the data.

FIG. 7 schematically shows an exemplary conventional variable-length code decoder. As shown in FIG. 7, a variable-length-code decoder 700 includes an input terminal 71, a codelength selector/shifter 72, a first code table 73, a second code table 74, and an output circuit 75. The codelength selector/shifter 72 contains a format of the input bit string (recorded in the hardware).

The operation of the variable-length-code decoder 700 having the above-described construction will be described in the case where two code tables of variable-length codes are used. An input bit string is input from an input terminal 71. The codelength selector/shifter 72 selects a corresponding variable-length code table, in accordance with the recorded format. For example, first, when a codeword of a first variable-length code is input, the codelength selector/shifter 72 selects the first code table 73, so as to decode the codeword. The decoded result (i.e., the decoded-word) is output to the output circuit 75.

Next, the codelength selector/shifter 72 selects the second code table 74 in accordance with the recorded format, and decodes a variable-length codeword belonging to the second variable-length code. Then, the decoded result is output to the output circuit 75. If the decoded result is zero, the zero data is directly output.

By repeating the above-described operation, the decoding of variable-length code is performed by the codelength selector/shifter 72 in accordance with the recorded format. Such a codelength selector/shifter 72 is described, for example, in "A parallel Variable-Length-Code Decoder for Advanced Television Applications", Third International Workshop on HDTV, by Ming-Ting Sun and Shaw-Min Lei.

In the above-described conventional variable-length-code decoder, if the format of the input bit string is changed, it is necessary to change the hardware of the circuit so as to accommodate the change of the format. If the decoded data is a series of zeros, it takes a lot of time to output a number of zero data, similar to the case where data having a value other than zero is to be output.

SUMMARY OF THE INVENTION

The variable-length-code decoder of the invention decodes an input bit stream including an input bit string having a codeword of a fixed-length code (a fixed-length codeword) and a plurality of codewords of variable-length codes (variable-length codewords), the fixed-length codeword and the variable-length codewords being combined in a predetermined format, the variable-length codes being at least two variable-length codes which are coded/decoded by using different code tables. The decoder includes: shift means for receiving the input bit string, shifting the received input bit string, and outputting the shifted input bit string by a unit of a predetermined number of bits; pattern detection means for detecting a specific pattern in the bit string output by the shift means, and outputting a detection signal; table means including at least two code tables provided for the at least two variable-length codes, respectively, each code table having a length of each codeword (codeword length) which belongs to a corresponding one of the variable-length codes and a decoded-word corresponding to the codeword, and outputting a codeword length and a decoded-word of a corresponding codeword based on the bit string output from the shift means; processing means for storing the format of the input bit string, outputting a length of the fixed-length code and decoded data of the fixed-length code, and selecting, for each of the plurality of variable-length codewords, one of the code tables to which the variable-length codeword belongs to, based on the detection signal and the format; codelength selection means for receiving the codeword length output from the table means and the length of the fixed-length code output from the processing means, for selectively inputting one of the codeword length and the fixed-length code to the shift means, and for setting a shift amount for the input bit string in the shift means; and output means for receiving the decoded-word output from the table means and the decoded data output from the processing means, and selectively outputting the decoded-word and the decoded data.

In one embodiment of the invention, the table means is memory means for storing the at least two code tables, and the processing means includes a code table selector for designating one of the at least two code tables stored in the memory means.

In another embodiment of the invention, the processing means performs a decoding of the fixed-length code and an operation using a decoded result of the variable-length code, in parallel with the selection of the code table.

In another embodiment of the invention, the input bit string is a frame data string based on a frame unit, and the input bit stream includes a plurality of successive frame data strings; the decoder further comprises means for inputting a flag indicating an error occurring in the frame data string to the processing means; and when the processing means receives the flag for the codeword of the fixed-length code in the frame data string, the processing means continues a decoding operation of the input bit string by interpolating the fixed-length codeword including the error by a decoded data of a fixed-length codeword which has already been decoded, and when the processing means receives the flag for the codeword of the variable-length code in the frame data string, the processing means stops a decoding operation of the frame data string including the variable-length codeword having the error and interpolates the frame data string by a frame data string which has already been decoded.

In another embodiment of the invention, each of the plurality of frame data strings includes an intraframe coded data string and an interframe coded data string, and when a decoding of any one of the frame data strings is stopped by receiving the flag, the processing means restarts a decoding from a head of an intraframe coded data string which immediately follows in the input bit stream.

In another embodiment of the invention, the input bit string is a frame data string based on a frame unit, the input bit stream includes a plurality of successive frame data strings, and each of the plurality of frame data strings includes an intraframe coded data string and an interframe coded data string, and when a time period required for decoding the intraframe coded data string exceeds a prescribed time period, a decoding of a next interframe coded data string in the input bit stream is not performed.

In another embodiment of the invention, when the time period required for decoding the intraframe coded data string exceeds the prescribed time period and the decoding of the interframe coded data string next to the intraframe coded data string is not performed, the processing means restarts the decoding from a head of an intraframe coded data string which immediately follows in the input bit stream.

In another embodiment of the invention, in at least one of the plurality of variable-length codes, the decoded-word represents data by a runlength of successive zeros in the data and a data value other than the successive zeros; the output means includes a memory for temporarily storing the decoded-word, and address means for designating an address of the decoded-word in the memory; the address means designates the address of the decoded-word by adding a value of the runlength of successive zeros plus 1 to a current address; the memory stores the data value of the decoded-word at the designated address; and every time when data stored in the memory is output, data of all addresses in the memory are reset to be zero, and an address designated by the address means is reset to be a starting address of the memory.

In another embodiment of the invention, in at least one of the plurality of variable-length codes, the decoded-word represents data by a runlength of successive zeros in the data and a data value other than the successive zeros; the code table corresponding to each of the variable-length codes has a length value which is the runlength of successive zeros plus 1 for each codeword; the output means includes a memory for temporarily storing the decoded-word, and addressing means for designating an address of the decoded-word in the memory; the address means designates the address of the decoded-word by adding a value of the length value of the decoded-word to a current address; the memory stores the data value of the decoded-word at the designated address; and every time when data stored in the memory is output, all data in the memory is reset to be zero, and an address designated by the address means is reset to be a starting address of the memory.

In another embodiment of the invention, the input bit stream includes a plurality of block data strings, each of the plurality of block data strings being generated by dividing video data into a plurality of blocks, orthogonally transforming and quantizing each of the plurality of blocks to generate a data block, and variable-length coding the data block; the decoded-word of the variable-length code represents data of a corresponding one of the data blocks by a runlength of successive zeros and a data value other than the successive zeros; when the data block has successive zeros continued from certain data to an end of the data block, a word corresponding to the data includes an end-of-block code; and during the decoding of the plurality of block data strings, when a decoded-word output from the table means has an end-of-block code, the decoding of the block data string is stopped.

In another embodiment of the invention, video data is divided into a plurality of blocks each of which is orthogonally transformed and quantized to generate a data block, and the data block is variable-length coded; the decoded-word of the variable-length code represents data of a corresponding one of the data blocks by a runlength of successive zeros and a data value other than the successive zeros, and when the data block has successive zeros continued from certain data to an end of the data block, a word corresponding to the data includes an end-of-block code; when a decoded-word output from the table means has an end-of-block code, the processing means finishes the decoding of the data block at the word; and the memory of the output means temporarily stores and outputs the data blocks, block by block, and when the decoding of the data block is stopped, the data which is currently held by the memory is output from the starting address to an address corresponding to the end of the data block in the memory.

According to another aspect of the invention, a variable-length-code decoding method for decoding an input bit stream including an input bit string having a codeword of a fixed-length code (a fixed-length codeword) and a plurality of codewords of variable-length codes (variable-length codewords), the fixed-length codeword and the variable-length codewords being combined in a predetermined format, the variable-length codes being at least two variable-length codes which are coded/decoded by using different code tables, each code table having a length of each codeword (codeword length) which belongs to a corresponding one of the variable-length codes and a decoded word corresponding to the codeword is provided. The decoding method includes the steps of: temporarily holding the input bit string, shifting the held input bit string by a set amount, and outputting the shifted input bit string by a unit of a predetermined number of bits; detecting a specific pattern in the output bit string of the predetermined number of bits, to produce a detection signal; processing the input bit string in accordance with the format thereof based on the detection signal, the processing step including the steps of: outputting, for the fixed-length code of the input bit string, a length of the fixed-length code and decoded data of the fixed-length code; selecting, for each of the plurality of variable-length codewords of the input bit string, one of the code tables of the variable-length codes to which the variable-length codeword belongs to; and selectively outputting, from the selected code table a codeword length and a decoded data of a codeword corresponding to the output bit string having the predetermined number of bits; selecting one of the codeword length and the length of the fixed-length code output in the processing step, so as to set the shift amount for the input bit string; and selectively outputting the decoded-word and the decoded data output in the processing step.

In one embodiment of the invention, the code tables for the at least two variable-length codes are stored in memory means, and the processing step includes a step of designating one of the code tables stored in the memory means.

In another embodiment of the invention, the processing step further includes a step of decoding the fixed-length code to produce the decoded data, and a step of performing an operation using the decoded-word.

In another embodiment of the invention, the input bit string is a frame data string based on a frame unit, and the input bit stream includes a plurality of successive frame data strings, and the processing step further includes the steps of: receiving a flag indicating an error occurring in the frame data string; when the flag for the codeword of the fixed-length code in the frame data string is received, continuing a decoding operation of the input bit string by interpolating the fixed-length codeword including the error by a decoded-word of a fixed-length codeword which has already been decoded; and when the flag for the codeword of the variable-length code in the frame data string is received, stopping a decoding operation of the frame data string including the variable-length codeword having the error and interpolating the frame data string by a frame data string which has already been decoded.

In another embodiment of the invention, each of the plurality of frame data strings includes an intraframe coded data string and an interframe coded data string, and in the processing step, when a decoding of any one of the frame data strings is stopped by receiving the flag, a decoding from a head of an intraframe coded data string which immediately follows in the input bit stream is restarted.

In another embodiment of the invention, the input bit string is a frame data string based on a frame unit, the input bit stream includes a plurality of successive frame data strings, and each of the plurality of frame data strings includes an intraframe coded data string and an interframe coded data string, and the method further comprises a step of, when a time period required for decoding the intraframe coded data string exceeds a prescribed time period, inhibiting a decoding of a next interframe coded data string in the input bit stream.

In another embodiment of the invention, when the time period required for decoding the intraframe coded data string exceeds the prescribed time period and the decoding of the interframe coded data string next to the intraframe coded data string is inhibited, the decoding from a head of an intraframe coded data string which immediately follows in the input bit stream is restarted.

In another embodiment of the invention, in at least one of the plurality of variable-length codes, the decoded-word represents data by a runlength of successive zeros in the data and a data value other than the successive zeros, and the method further comprises a step of temporarily storing the decoded-word selected from the code table in a memory to output the stored decoded-word, the step including: storing zero data at all addresses in the memory, and resetting a current address to a starting address of the memory; designating an address by adding a value of the runlength of successive zeros plus 1 to a current address; and storing the data value of the decoded-word at the designated address.

In another embodiment of the invention, in at least one of the plurality of variable-length codes, the decoded-word represents data by a runlength of successive zeros in the data and a data value other than the successive zeros; the code table corresponding to each of the variable-length codes has a length value which is the runlength of successive zeros plus 1 for each codeword; and the method further comprises a step of temporarily storing the decoded-word selected from the code table in a memory to output the stored decoded-word, the step including: storing zero data at all addresses in the memory, and resetting a current address to a starting address of the memory; designating an address by adding the length value of the decoded-word to the current address in the memory; and storing the data value of the decoded-word at the designated address.

In another embodiment of the invention, the input bit stream includes a plurality of block data strings, each of the plurality of block data strings being generated by dividing video data into a plurality of blocks, orthogonally transforming and quantizing each of the plurality of blocks to generate a data block, and variable-length coding the data block; the decoded-word of the variable-length codes represents data of a corresponding one of the data blocks by a runlength of successive zeros and a data value other than the successive zeros; when the data block has successive zeros continued from certain data to an end of the data block, a word corresponding to the data includes an end-of-block code; and when a decoded-word selected and output from the code table has an end-of-block code, the decoding of the block data string is stopped.

In another embodiment of the invention, video data is divided into a plurality of blocks each of which is orthogonally transformed and quantized to generate a data block, and the data block is variable-length coded; the decoded-word of the variable-length code represents data of a corresponding one of the data blocks by a runlength of successive zeros and a data value other than the successive zeros, and when the data block has successive zeros continued from certain data to an end of the data block, a word corresponding to the data includes an end-of-block code; when a decoded-word selected and output from the code table has an end-of-block code, the decoding of the data block is stopped at the word; and when the end-of-block code is written at an address in the memory, the data which is currently held by the memory is output from the starting address to an address corresponding to the end of the data block in the memory.

Thus, the invention described herein makes possible the following advantages. (1) When the format of the input coded data (the input bit string) is changed, it is possible to accommodate the change of format only by changing the program of the processor without changing the hardware of the variable-length-code decoder. (2) A rapid decoding operation can be implemented by performing the decoding of the variable-length code with reference to a code table and at the same time (in parallel) by performing an operation using the result of the decoded results of the fixed-length code and the variable-length code. (3) When the decoded data is a series of zeros, the time for outputting the zero data is shortened. (4) When an error occurs in the input bit string, a method for handling the error is selected depending on whether the error occurs in the fixed-length code or in the variable-length code. Moreover, if the decoding operation is not completed within a predetermined time period (i.e., if a required processing rate is not attained), the decoding of a code of low significance is omitted, so that the decoding operation does not fail, and the required processing rate can be realized.

These and other advantages of the present invention will become apparent to those skilled in the art upon reading and understanding the following detailed description with reference to the accompanying figures.

BRIEF DESCRIPTION OF THE DRAWINGS

FIG. 4 is a diagram showing an example of a first code table.

FIG. 5 is a diagram showing an example of a second code table.

FIG. 6 is a block diagram showing an output circuit according to the invention.

DESCRIPTION OF THE PREFERRED EMBODIMENTS

Hereinafter, a variable-length-code decoder 100 in one example of the invention will be described with reference to the accompanying drawings.

Figure 1:
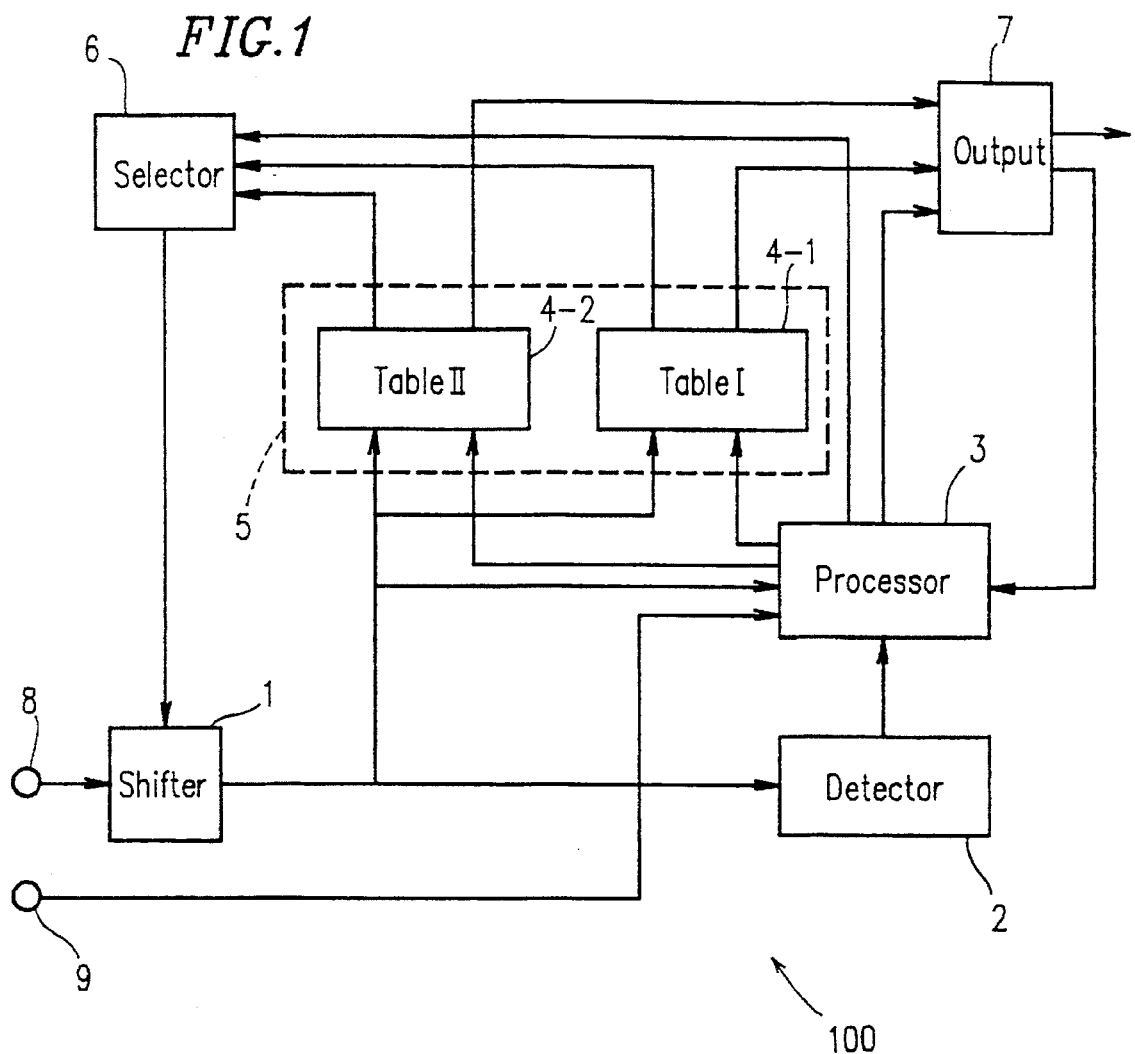
FIG. 1 is a block diagram showing a variable-length-code decoder in one example of the invention.

FIG. 1 schematically shows the construction of a variable-length-code decoder 100 in one example of the invention. As shown in FIG. 1, the variable-length-code decoder 100 includes a shifter 1 for shifting an input bit string by the desired number of bits, a pattern detector 2 for detecting a specific pattern in the input bit string, a processor 3, a first code table 4-1 and a second code table 4-2, a codelength selector 6 for selecting a codelength, an output circuit 7 for outputting decoded data (words decoded from variable-length and fixed-length codewords), a first input terminal 8 for inputting the input bit string, and a second input terminal 9 for inputting an error flag.

Through the input terminal 8, coded data is input as a bit stream including bit strings in each of which fixed-length codes, variable-length codes, and necessary bit patterns such as a header pattern are combined in a predetermined format.

Figure 2:
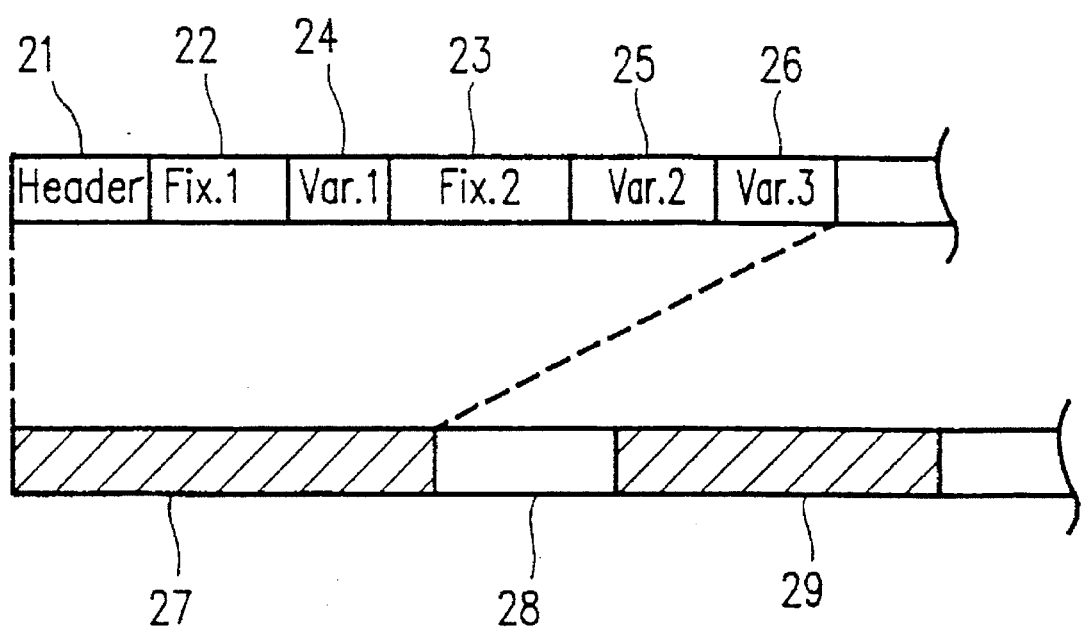
FIG. 2 is a diagram schematically showing an input bit string in one example of the invention.

FIG. 2 schematically shows the input bit stream. In this example, the input bit stream includes data strings of compressed and coded video data. The coded video data is, for example, produced by dividing a video image into blocks, each including n pixels in a horizontal direction and m pixels in a vertical direction (n and m are integers); by orthogonally transforming and quantizing each block; and then by variable-length coding (compressing and encoding) them. The compressed and encoded video data is transmitted/received as a bit string which is formatted in accordance with the transmission system, and the bit string is input into a decoder. The video data string includes both intraframe and interframe coded data.

FIG. 2 shows intraframe coded data 27, interframe coded data 28, and the next intraframe coded data 29. Each of the intra-frame coded data and the inter-frame coded data is formatted in accordance with a prescribed manner. For example, the intra-frame coded data 27 includes a header pattern 21, a first fixed-length code 22, a first codeword of one variable-length code (a first variable-length codeword) 24, a second fixed-length code 23, a second codeword of the other variable-length code (a second variable-length codeword) 25, and a third codeword of the other variable-length code (a third variable-length codeword) 26. The codelengths of the first and second fixed-length codes 22 and 23 are different from each other. A first code table is used for the first variable-length codeword 24, and a second code table is used for the second variable-length codeword 25 and the third variable-length codeword 26. The second code table is different from the first code table. The inter-frame coded data 28 and the intra-frame coded data 29 are also formatted in the same manner as described above.

A predetermined number of bits of the input bit string is input into the shifter 1 at each time. The shifter 1 shifts the position in the bit string which has been input and latched, by bits the number of which corresponds to the codelength (the codeword length of the variable-length code or the length of the fixed-length code) applied from the codelength selector 6. The shift can be, for example, implemented by shifting a pointer which indicates the bit position.

Figure 3:
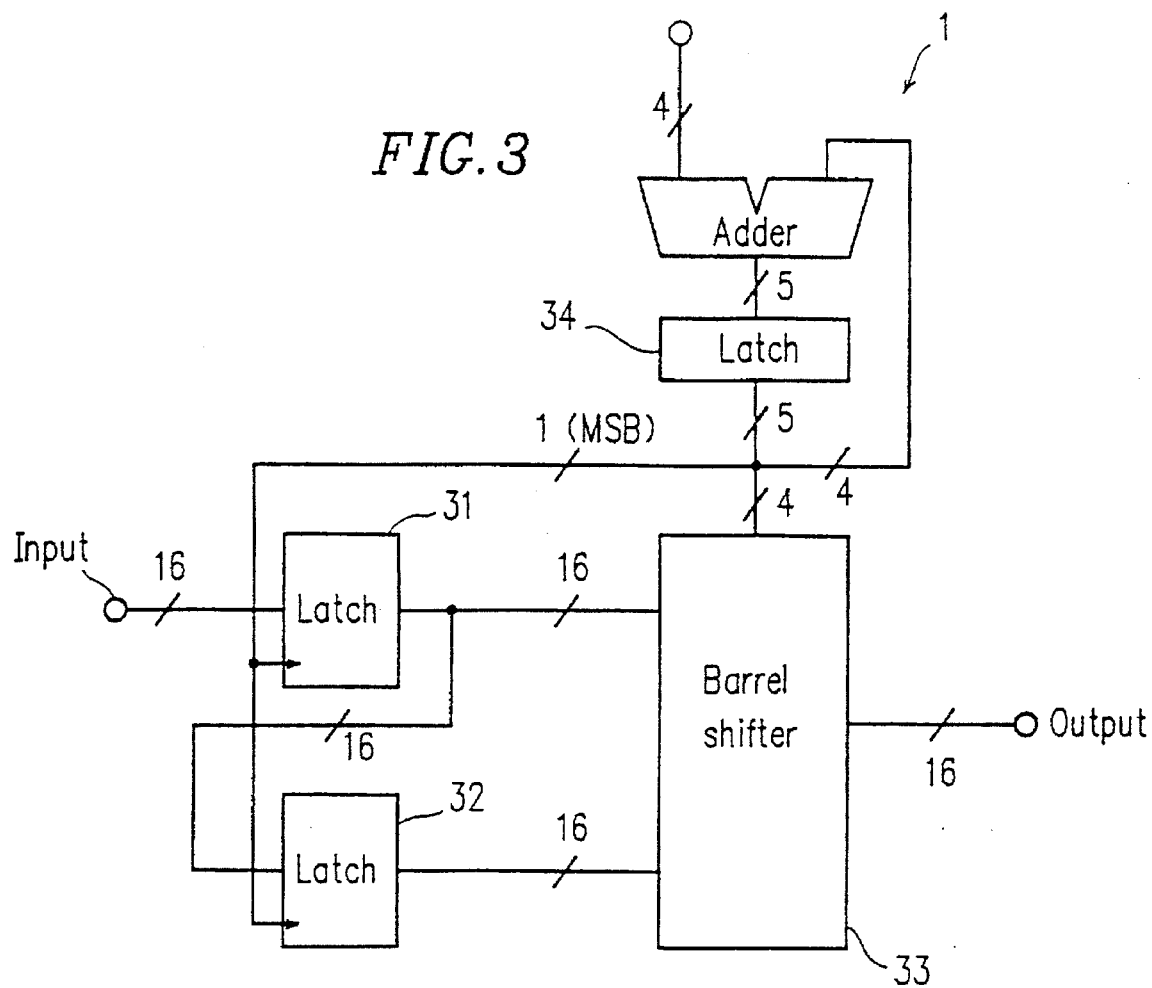
FIG. 3 is a diagram showing an exemplary shifter in one example of the invention.
Figure 7:
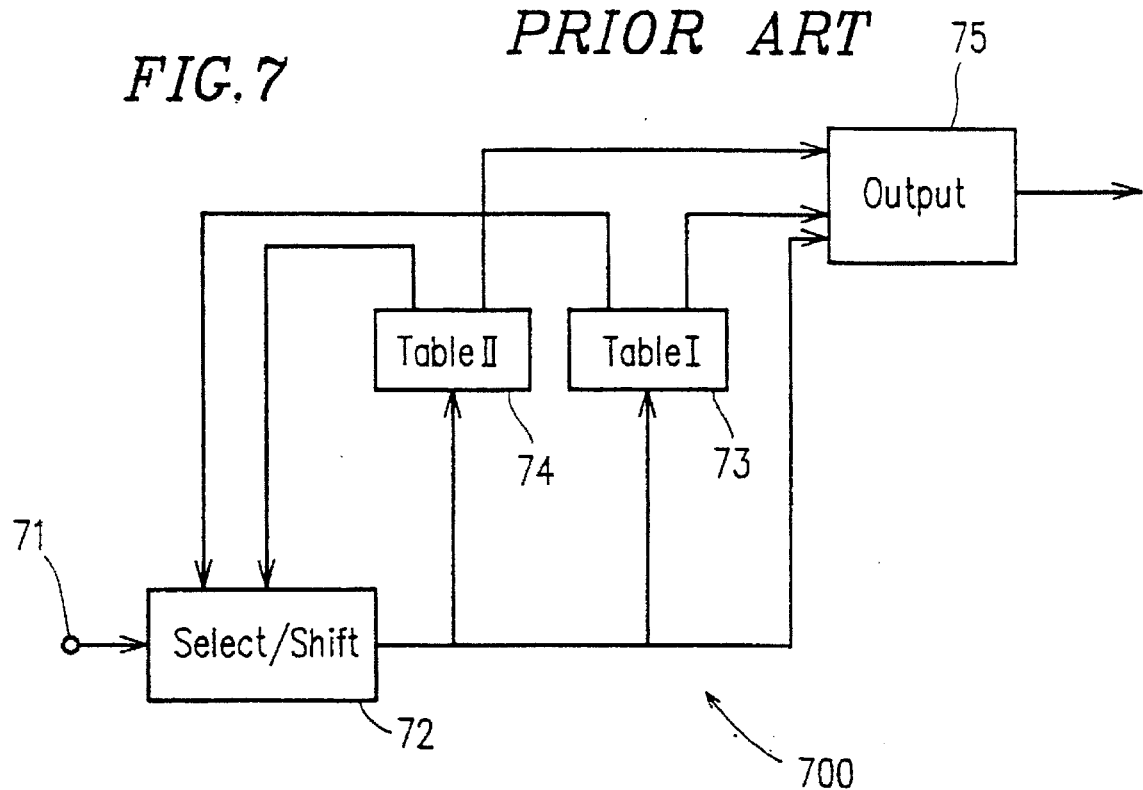
FIG. 7 is a block diagram showing a conventional variable-length-code decoder.

FIG. 3 shows an exemplary shifter 1. In the shifter 1 shown in FIG. 3, halves of successive 32 bits of the input bit string are received by each of two latches 31 and 32, respectively. That is, each of the latches 31 and 32 receives 16 bits. A barrel shifter 33 outputs data of 16 bits from the bit position designated by the latch 34 among the input 32 bits. In the case of the shifter 1 shown in FIG. 3, the codeword length of the variable-length code can be 16 bits at the maximum.

As shown in FIG. 1, the bit string consisting of a predetermined number of bits output from the shifter 1 is applied to the pattern detector 2, the processor 3, the first code table 4-1, and the second code table 4-2.

The pattern detector 2 detects a specific pattern in the bit string output from the shifter 1, and the detected result is output to the processor 3. The pattern detector 2 can be, for example, implemented by a comparator. Specifically, the pattern detector 2 detects a header pattern 21 in the input bit string, and the detection signal is applied to the processor 3. The processor 3 knows the start of the format of the input bit string by the detection signal of the header pattern.

At the second input terminal 9, an error flag indicating whether there is an error in the input bit string or not is input from an error detector (not shown) which is provided outside of the apparatus. The input error flag is applied to the processor 3.

The first code table 4-1 and the second code table 4-2 can be recorded in the memory 5. The memory 5 can be implemented by using a read-only memory (ROM) or a content addressable memory (CAM). Alternatively, a programmable logic array (PLA) can be used. In this example, two kinds of variable-length codes and two code tables are used for the description. However, the number of kinds of variable-length codes and the number of code tables are not limited to two, but can be set to any desired plural number, as required. The memory 5 stores the plurality of code tables, and can selectively use a desired number of necessary code tables in accordance with the format of the input bit string.

In this example, a first code table 4-1 is used for the first variable-length code 24 shown in FIG. 2, and a second code table 4-2 is used for the second and third variable-length codes 25 and 26 shown in FIG. 2. Each of the code tables includes a codelength of each codeword of the corresponding variable-length code, and a decoded-word corresponding to the codeword (i.e., the data coded by the variable-length code).

FIGS. 4 and 5 show exemplary first and second code tables. These code tables show the case where the maximum codelength of the variable-length code is 6 bits. Herein, in the case where the shifter 1 shown in FIG. 3 is employed, the code table may receive the first 6 bits among the 16 bits output from the shifter 1. Alternatively, the shifter 1 may be constructed so that the shifter 1 outputs a bit string of 6 bits and the bit string is applied to the code table.

The processor 3 previously stores the format of the input bit string, and contains a prescribed decoding operation program in accordance with this format. The processor 3 performs the decoding operation of the fixed-length code in the input bit string in accordance with the format. The processor 3 outputs the fixed length of the fixed-length code to the codelength selector 6, and also applies the decoded-word (i.e., the data coded by the fixed-length code) to the output circuit 7. In the case where the input bit string is a variable-length code, the processor 3 selects a corresponding code table in accordance with the format. For example, either one of the first and second code tables is supplied with an enable signal, so that one code table used for the decoding operation can be designated.

FIG. 6 shows the output circuit 7 of this example of the invention, in detail. As shown in FIG. 6, the output circuit 7 includes: an input switching circuit 64 having an input terminal 61 which receives the decoded data from the first code table, an input terminal 62 which receives the decoded data from the second code table, and an input terminal 63 which receives the decoded data from the processor 3; a writing address generator 65; a memory 66, and an output terminal 67 which is connected to the processor 3. The input switching circuit 64 selects one of the inputs through the input terminals 61, 62, and 63, in accordance with the signal applied from the processor 3. The writing address generator 65 is used for obtaining the address which indicates the position at which the decoded data is to be written.

The decoding operation of the variable-length-code decoder 100 having the above-described construction will be described in the case where there are two code tables of variable-length codes. First, the normal decoding operation with no error in the input bit string is described.

It is assumed that the input bit string shown in FIG. 2 is input into the shifter 1. The bit string input into the shifter 1 includes the header pattern 21 at the head thereof. Thus, the header is detected by the pattern detector 2. The pattern detector 2 outputs the detection signal to the processor 3. The processor 3 responds to the detection signal, and outputs the bit length of the header pattern to the codelength selector 6 as the codelength. Since the processor 3 previously stores the format of the input bit string, the processor 3 outputs the bit length of the header pattern 21 based on this format.

The codelength selector 6 selects a codelength applied from the processor 3 among the input signals, and outputs it to the shifter 1. The shifter 1 shifts the input bits string in the barrel shifter 33, in accordance with the applied codelength (i.e., shifts the input bit string by the number of bits of the header pattern 21). As the result of the shift, the pointer in the shifter 1 indicates the start of the first fixed-length code 22 arranged next to the header pattern 21. The shifter 1 outputs the data of a predetermined number of bits from the position of the pointer.

The processor 3 latches the first fixed-length code 22 from the applied bit string to the working area in accordance with the programmed format (the data latched in the processor 3 is directly store in the working area). Then, as in the case of the header pattern 21, the fixed-length codelength is output to the codelength selector 6. The codelength selector 6 selects the codelength applied from the input processor 3 among the input signals, and outputs the selected codelength to the shifter 1. The shifter 1 shifts the held input bit string by the number of bits of the first fixed-length code, in accordance with the applied codelength. By this shift, the shifter 1 outputs a bit string having a codeword 24 of the first variable-length code arranged next to the first fixed-code 22 as its starting position. As described above, the output bit string is applied to the pattern detector 2, the processor 3, and the first and second code tables. Herein, only the bit string applied to the first code table 4-1 is effectively used for the decoding operation (as will described below).

Next, the processor 3 designates the first code table 4-1, in accordance with the programmed format. By this designation, the bit string applied to the first code table 4-1 is made effective. The first code table 4-1 outputs the codeword length of the codeword 24 included in the bit string applied from the shifter 1 and the decoded-word corresponding to the codeword 24. The codeword length is applied to the codelength selector 6, and the decoded-word is applied to the output circuit 7.

The decoding operation is performed by referring to the code table in the following manner. For simplicity, the maximum codeword length of each of the first and second variable-length codes is 6 bits, and the bit string received by each code table is 6 bits.

In FIG. 4, the address 40 of the first code table 4-1 is a bit string applied from the shifter 1. Accordingly, when one bit string is input, one address 40 is designated. All or part of each address (bit string) constitutes one codeword of the first variable-length code. In the address, the codeword length 41 of the code word included in the bit string and the decoded-word 42 corresponding to the codeword are recorded. For example, in the case where the codeword length is 4 bits (100), the most significant 4 bits of the address (6 bits) are the codeword. The remaining least significant 2 bits are a part of the next succeeding codeword. If the codelength is 0 bit (000), the codelength indicates that the bit pattern of the address is a bit pattern which never occurs as the variable-length code.

The decoded-word 42 is applied to an input terminal 61 of the output circuit 7. The output circuit 7 outputs the decoded-word 42 to the processor 3 via an output terminal 67, in response to the signal from the processor 3 (the decoded-word 42 applied to the processor 3 is used for the next stage of the decoding operation).

On the other hand, the codelength selector 6 selects a codeword length from the first code table 4-1 which is referred to, among the input signals, and outputs the codeword length 41 to the shifter 1. The shifter 1 shifts the held output bit string by the codeword length of the first variable-length codeword 24. Accordingly, the pointer in the shifter 1 points to the start of the second fixed-length code 23. From the shifter 1, a bit string including the second fixed-length code 23 as its starting bits.

Next, the processor 3 latches the second fixed-length code 23 included in the bit string applied from the shifter 1, in accordance with the shifter 1 (the data latched by the processor 3 is directly stored in the working area). Then, as in the case of the first fixed-length code 22, the (fixed) codelength is output to the codelength selector 6. The codelength selector 6 selects the codelength applied from the processor 3 among the input signals, and outputs the selected codelength to the shifter 1. The shifter 1 shifts the held input bits string by the number of bits of the second fixed-length code 23, in accordance with the applied codelength. By this shift, the shifter 1 outputs a bit string including the codeword 25 of the second variable-length code as its starting bits.

Since the second variable-length codeword 25 belongs to a code table which is different from that for the first variable-length codeword 24, the processor 3 designates the second code table 4-2 in accordance with the format. This designation makes the bit string applied to the second code table 4-2 effective. Then, the second code table 4-2 outputs a codeword length of the codeword 25 included in the bit string, and a decoded-word corresponding to the codeword 25. The codeword length is applied to the codelength selector 6, and the decoded-word is applied to the output circuit 7.

FIG. 5 shows an example of the second code table 4-2. Similar to the first code table shown in FIG. 4, the address 50 of the second code table 4-2 is a bit string applied from the shifter 1. In the address 50, a codeword length 51 of the codeword included in the bit string of the address 50 and a decoded-word 52 corresponding to the codeword are recorded. Herein, in the decoded-word 52, the most significant 6 bits indicate the number of successive zeros in the data, and the least significant 12 bits indicate the value of data (not equal to zero) succeeding to the successive zeros.

In other words, the decoded-word 52 has a two-dimensional representation obtained by combining the runlength of zero in the data string with the value of data which is not the successive zeros (which are indicated by the runlength). In the video data string to be coded (i.e., in the series of decoded-words), when zeros are continued from the middle of a certain block to the end of the block, an end-of-block (EOB) code is coded, instead of the number of successive zeros.

In the example of the code table shown in FIG. 4, the decoded-word 42 does not include the runlength information of zeros, but is indicated in a manner adapted to the decoded-word 52 shown in FIG. 5. That is, the most significant 6 bits of the decoded-word 42 are all zero, and the least significant 12 bits indicate the value of the substantial data. By constituting the decoded-word 42 in this way, it is possible to process a decoded-word, irrespective of whether the decoded-word is output from the first code table or the second code table in the output circuit 7.

The decoded-word 52 is applied to the output circuit 7. As shown in FIG. 6, the decoded-word 52 is applied to the first terminal 62, and the input switching circuit 64 selects the input from the second code table 4-2, in response to the signal from the processor 3.

When the variable-length codeword is to be decoded, addresses and all data in the address generator 65 and the memory 66 in the output circuit 7 are reset to zero every time a decoding operation for one block is completed. In other words, when a decoding operation for another block is to be started, the memory 66 is filled with zeros. This "zero filling" can be implemented by using, for example, a flash memory. Alternatively, it can be implemented by writing zero into the memory 66 at the same time when the data is read out from the memory 66.

The address generator 65 generates an address at which the value which is not the successive zeros (the least significant 12 bits) is to be written, in the following manner. First, the most significant 6 bits of the decoded-word 52 is input to the address generator 65. The address generator 65 increments the current writing address by a value equal to the number obtained by adding 1 to the number of successive zeros indicated by the 6 bits. Alternatively, in the second code table 4-2, the value of "the number of successive zeros+1" can be previously recorded in the most significant 6 bits (i.e., the bits indicating the runlength). In this case, it is sufficient for the address generator 65 to increment the address by the value indicated by the most significant 6 bits. The value which is indicated by the least significant 12 bits is written into the address in the memory 66 designated by the address generator 65.

On the other hand, the codelength selector 6 selects a codeword length 51 from the second code table 4-2 which is referred to, among the input signals, and the selected codeword length 51 is output to the shifter 1. The shifter 1 shifts the held input bit string by the codeword length of the second variable-length codeword 25. As a result, the pointer in the shifter 1 indicates the start of a third variable-length codeword 26. The shifter 1 outputs a bit string including the third variable-length codeword 26 as its starting bits.

In the same way, the third variable-length codeword 26 is decoded. In this example, the third variable-length codeword 26 belongs to the variable-length codes which use the second code table 4-2. Accordingly, the decoding operation is performed while the processor 3 also designates the second code table 4-2.

By repeating the above-described operations, the decoding of the variable-length codes can be performed. When the processor 3 detects the EOB code in the decoded-word, the address of the address generator 65 is reset to be zero. Then, before the decoding for the next block is started, the data stored in the memory 66 is read out by the number of addresses included in one block from the start of the address of the memory 66. As a result, the decoded-word can be rapidly output. For example, in the case of a block having a value which is not zero in the leading portion of the block data string, the EOB code is recorded immediately after the portion. When the EOB code is detected, all the data of the block can be output without requiring the writing of succeeding successive zeros.

When the decoding of variable-length code is performed with reference to the code table, the processor 3 performs the parallel operation for fixed-length code data which has been stored in the working area. Then, an operation using the result (the decoded-word) obtained by decoding the variable-length codeword is performed (e.g., an operation for restoring the differential data of fixed-length code).

The first and second code table, codewords, and decoded-words are only shown exemplarily. It is understood by a person of ordinary skill in the art that various different schemes can be used in accordance with the format of the input bit string and the employed variable-length code.

Next, the operation when the input bit string includes an error will be described. When an error occurs in the input bit string, the error flag from the external error detector (not shown) is input into the processor 3 via the error flag input terminal 9.

The case where an error flag is input during the processing of the intraframe coded data 27 or the interframe coded data 28 shown in FIG. 2 will be described. When an error occurs in the fixed-length code data, the decoding operation is continued by alternatively using the previously decoded value. The processor 3 outputs, for example, a previous value which is held in the working area to the output circuit 7, and applies the codelength of the fixed-length code including the error to the codelength selector 6.

When the error occurs in the variable-length codes of the intraframe coded data 27, the processor 3 stops the decoding operation. The processor 3 outputs a codelength for setting an appropriate shift amount until the header pattern of the next intraframe coded data 29 can be detected. The output codelength is applied to the shifter 1 via the codelength selector 6. The shifter 1 outputs the input bit string by a unit of a predetermined number of bits in accordance with the shifting codelength. When the header pattern of the second intraframe coded data 29 is detected in the pattern detector 2, and the detection signal is applied to the processor 3, the processor 3 restarts the decoding operation in accordance with the programmed format. The skipped data is interpolated by the data which has been already decoded.

When an error occurs in the variable-length codes of the interframe coded data 28, the whole of the interframe coded data 28 is interpolated by the intraframe coded data 27 which has been already decoded. Similar to the above-described manner, the decoding is restarted from the next intraframe coded data 29.

Next, the operation in the case where the decoding operation of the variable-length code is not completed in a predetermined time period will be described. For example, since the video data of complicated patterns is to be coded, the variable-length coded data is too long to be decoded within the predetermined time period.

In the case where the decoding operation of the intraframe coded data 27 shown in FIG. 2 is performed, even when the decoding operation is not completed within the predetermined processing time, the decoding operation of the intraframe coded data 27 is completely performed. Then, the decoding operation of the next interframe coded data 28 is not performed and skipped, and the decoding operation is restarted from the second intraframe coded data 29. The skip is performed in the same way as described above, i.e., by outputting a codelength for setting an appropriate shift amount from the processor 3, until the header pattern of the intraframe coded data 29 is detected by the pattern detector 2. When a desired header pattern can be detected, the decoding operation is restarted from the position in accordance with the format which is programmed in the processor 3.

By performing the above-described decoding operation, even if an extraordinary long variable-length coded data appears, the intraframe coded data is restored without fail, and the interframe coded data is appropriately skipped. As a result, a prescribed processing rate can be realized without reducing the quality of the reproduced video image.

As described above, according to the invention, by previously programming the format of the input bit string in the processor, the change of the format of the input bit string can be accommodated by the change of program without changing the hardware. In addition, in parallel with the decoding of the variable-length code with reference to the table, the processing of the fixed-length code and the operation using the decoded result of the variable-length code are performed in the processor. Thus, a high bit rate decoding operation can be realized. Moreover, in the case where the decoded data string includes successive zeros, it is unnecessary to write the zero data one by one. Thus, it is possible to shorten the output time period for the decoded data.

Even when an error occurs in the input bit string, the method for handling the error can be selectively changed depending on whether the error occurs in the fixed-length code or in the variable-length code. If the decoding operation is not completed in a predetermined time period (i.e., if a required processing rate is not attained), the decoding of coded data of lower significance is omitted, so that the required processing rate can be realized without failing the decoding operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A variable-length-code decoder which decodes an input bit stream including an input bit string having a codeword of a fixed-length code (a fixed-length codeword) and a plurality of codewords of variable-length codes (variable-length codewords), the fixed-length codeword and the variable-length codewords being combined according to a format, the variable-length codes being at least two variable-length codes by which data is coded/decoded using different code tables, the decoder comprising:

shift means for receiving the input bit string, shifting the received input bit string, and outputting the shifted input bit string by a unit, said unit comprising a predetermined number of bits;

pattern detection means for detecting a specific pattern in the bit string output by the shift means, and outputting a detection signal;

table means including at least two code tables provided for the at least two variable-length codes, respectively, each code table having a length of each codeword (codeword length) which belongs to a corresponding one of the variable-length codes and a decoded-word corresponding to the codeword, and outputting a codeword length and a decoded-word of a corresponding codeword based on the bit string output from the shift means; processing means for identifying and storing the format of the input bit string, outputting a length of the fixed-length code and decoded data of the fixed-length code, and selecting, for each of the plurality of variable-length codewords, one of the code tables to which the variable-length codeword belongs, based on the detection signal and the format;

codelength selection means for receiving the codeword length output from the table means and the length of the fixed-length code output from the processing means, for selectively inputting one of the codeword a length and the fixed-length code to the shift means, and for setting a shift amount for the input bit string in the shift means; and output means for receiving the decoded-word output from the table means and the decoded data output from the processing means, and selectively outputting the decoded-word and the decoded data.

2. A variable-length-code decoder according to claim 1, wherein the table means is memory means for storing the at least two code tables, and the processing means includes a code table selector for designating one of the at least two code tables stored in the memory means.

3. A variable-length-code decoder according to claim 1, wherein the processing means performs a decoding of the fixed-length code and an operation using a decoded result of the variable-length code, in parallel with the selection of the code table.

4. A variable-length-code decoder according to claim 1, wherein the input bit string is a frame data string based on a frame unit, and the input bit stream includes a plurality of successive frame data strings;

the decoder further comprises means for inputting a flag indicating an error occurring in the frame data string to the processing means; and when the processing means receives the flag for the codeword of the fixed-length code in the frame data string, the processing means continues a decoding operation of the input bit string by interpolating the fixed-length codeword including the error by a decoded data of a fixed-length codeword which has already been decoded, and when the processing means receives the flag for the codeword of the variable-length code in the frame data string, the processing means stops a decoding operation of the frame data string including the variable-length codeword having the error and interpolates the frame data string by a frame data string which has already been decoded.

5. A variable-length-code decoder according to claim 4, wherein each of the plurality of frame data strings includes an intraframe coded data string and an interframe coded data string, and when a decoding of any one of the frame data strings is stopped by receiving the flag, the processing means restarts a decoding from a head of an intraframe coded data string which immediately follows in the input bit stream.

6. A variable-length-code decoder according to claim 1, wherein the input bit string is a frame data string based on a frame unit, the input bit stream includes a plurality of successive frame data strings, and each of the plurality of frame data strings includes an intraframe coded data string and an interframe coded data string, and when a time period required for decoding the intraframe coded data string exceeds a prescribed time period, a decoding of a next interframe coded data string in the input bit stream is not performed.

7. A variable-length-code decoder according to claim 6, wherein when the time period required for decoding the intraframe coded data string exceeds the prescribed time period and the decoding of the interframe coded data string next to the intraframe coded data string is not performed, the processing means restarts the decoding from a head of an intraframe coded data string which immediately follows in the input bit stream.

8. A variable-length-code decoder according to claim 1, wherein: in at least one of the plurality of variable-length codes, the decoded-word represents data by a runlength of successive zeros in the data and a data value other than the successive zeros;

the output means includes a memory for temporarily storing the decoded-word, and address means for designating an address of the decoded-word in the memory;

the address means designates the address of the decoded-word by adding a value of the runlength of successive zeros plus 1 to a current address;

the memory stores the data value of the decoded-word at the designated address; and every time when data stored in the memory is output, data of all addresses in the memory are reset to be zero, and an address designated by the address means is reset to be a starting address of the memory.

9. A variable-length-code decoder according to claim 8, wherein video data is divided into a plurality of blocks each of which is orthogonally transformed and quantized to generate a data block, and the data block is variable-length coded;

the decoded-word of the variable-length code represents data of a corresponding one of the data blocks by a runlength of successive zeros and a data value other than the successive zeros, and when the data block has successive zeros continued from certain data to an end of the data block, a word corresponding to the data includes an end-of-block code;

when a decoded-word output from the table means has an end-of-block code, the processing means finishes the decoding of the data block at the word; and the memory of the output means temporarily stores and outputs the data blocks, block by block, and when the decoding of the data block is stopped, the data which is currently held by the memory is output from the starting address to an address corresponding to the end of the data block in the memory.

10. A variable-length-code decoder according to claim 1, wherein: in at least one of the plurality of variable-length codes, the decoded-word represents data by a runlength of successive zeros in the data and a data value other than the successive zeros;

the code table corresponding to each of the variable-length codes has a length value which is the runlength of successive zeros plus 1 for each codeword;

the output means includes a memory for temporarily storing the decoded-word, and addressing means for designating an address of the decoded-word in the memory;

the address means designates the address of the decoded-word by adding a value of the length value of the decoded-word to a current address;

the memory stores the data value of the decoded-word at the designated address; and every time when data stored in the memory is output, all data in the memory is reset to be zero, and an address designated by the address means is reset to be a starting address of the memory.

11. A variable-length-code decoder according to claim 1, wherein: the input bit stream includes a plurality of block data strings, each of the plurality of block data strings being generated by dividing video data into a plurality of blocks, orthogonally transforming and quantizing each of the plurality of blocks to generate a data block, and variable-length coding the data block;

the decoded-word of the variable-length code represents data of a corresponding one of the data blocks by a runlength of successive zeros and a data value other than the successive zeros;

when the data block has successive zeros continued from certain data to an end of the data block, a word corresponding to the data includes an end-of-block code; and during the decoding of the plurality of block data strings, when a decoded-word output from the table means has an end-of-block code, the decoding of the block data string is stopped.

12. A variable-length-code decoding method for decoding an input bit stream including an input bit string having a codeword of a fixed-length code (a fixed-length codeword) and a plurality of codewords of variable-length codes (variable-length codewords), the fixed-length codeword and the variable-length codewords being combined according to a format, the variable-length codes being at least two variable-length codes by which data is coded/decoded a using different code tables, each code table having a length of each codeword (codeword length) which belongs to a corresponding one of the variable-length codes and a decoded word corresponding to the codeword, the decoding method comprising the steps of:

temporarily holding the input bit string, shifting the held input bit string by a set amount, and outputting the shifted input bit string by a unit, said unit comprising a predetermined number of bits;

detecting a specific pattern in the output bit string of the predetermined number of bits, to produce a detection signal;

identifying the format of the input bit string;

processing the input bit string in accordance with the format thereof based on the detection signal, the processing step including the steps of:

outputting, for the fixed-length code of the input bit string, a length of the fixed-length code and decoded data of the fixed-length code;

selecting, for each of the plurality of variable-length codewords of the input bit string, one of the code tables of the variable-length codes to which the variable-length codeword belongs; and selectively outputting, from the selected code table, a codeword length and a decoded-word of a codeword corresponding to the output bit string having the predetermined number of bits;

selecting one of the codeword length and the length of the fixed-length code output in the processing step, so as to set the shift amount for the input bit string; and selectively outputting the decoded-word and the decoded data output in the processing step.

13. A variable-length-code decoding method according to claim 12, wherein the code tables for the at least two variable-length codes are stored in memory means, and the processing step includes a step of designating one of the code tables stored in the memory means.

14. A variable-length-code decoding method according to claim 12, wherein the processing step further includes a step of decoding the fixed-length code to produce the decoded data, and a step of performing an operation using the decoded-word.

15. A variable-length-code decoding method according to claim 12, wherein the input bit string is a frame data string based on a frame unit, and the input bit stream includes a plurality of successive frame data strings, and the processing step further includes the steps of:

receiving a flag indicating an error occurring in the frame data string;

when the flag for the codeword of the fixed-length code in the frame data string is received, continuing a decoding operation of the input bit string by interpolating the fixed-length codeword including the error by a decoded data of a fixed-length codeword which has already been decoded; and when the flag for the codeword of the variable-length code in the frame data string is received, stopping a decoding operation of the frame data string including the variable-length codeword having the error and interpolating the frame data string by a frame data string which has already been decoded.

16. A variable-length-code decoding method according to claim 15, wherein each of the plurality of frame data strings includes an intraframe coded data string and an interframe coded data string, and in the processing step, when a decoding of any one of the frame data strings is stopped by receiving the flag, a decoding from a head of an intraframe coded data string which immediately follows in the input bit stream is restarted.

17. A variable-length-code decoding method according to claim 12, wherein the input bit string is a frame data string based on a frame unit, the input bit stream includes a plurality of successive frame data strings, and each of the plurality of frame data strings includes an intraframe coded data string and an interframe coded data string, and the method further comprises a step of, when a time period required for decoding the intraframe coded data string exceeds a prescribed time period, inhibiting a decoding of a next interframe coded data string in the input bit stream.

18. A variable-length-code decoding method according to claim 17, wherein when the time period required for decoding the intraframe coded data string exceeds the prescribed time period and the decoding of the interframe coded data string next to the intraframe coded data string is inhibited, the decoding from a head of an intraframe coded data string which immediately follows in the input bit stream is restarted.

19. A variable-length-code decoding method according to claim 12, wherein, in at least one of the plurality of variable-length codes, the decoded-word represents data by a runlength of successive zeros in the data and a data value other than the successive zeros, and the method further comprises a step of temporarily storing the decoded-word selected from the code table in a memory to output the stored decoded-word, the step including:

storing zero data at all addresses in the memory, and resetting a current address to a starting address of the memory;

designating an address by adding a value of the runlength of successive zeros plus 1 to a current address; and storing the data value of the decoded-word at the designated address.

20. A variable-length-code decoding method according to claim 12, wherein: in at least one of the plurality of variable-length codes, the decoded-word represents data by a runlength of successive zeros in the data and a data value other than the successive zeros;

the code table corresponding to each of the variable-length codes has a length value which is the runlength of successive zeros plus 1 for each codeword; and the method further comprises a step of temporarily storing the decoded-word selected from the code table in a memory to output the stored decoded-word, the step including:

storing zero data at all addresses in the memory, and resetting a current address to a starting address of the memory;

designating an address by adding the length value of the decoded-word to the current address in the memory; and storing the data value of the decoded-word at the designated address.

21. A variable-length-code decoding method according to claim 12, wherein: the input bit stream includes a plurality of block data strings, each of the plurality of block data strings being generated by dividing video data into a plurality of blocks, orthogonally transforming and quantizing each of the plurality of blocks to generate a data block, and variable-length coding the data block;

the decoded-word of the variable-length codes represents data of a corresponding one of the data blocks by a runlength of successive zeros and a data value other than the successive zeros;

when the data block has successive zeros continuing from certain data to an end of the data block, a word corresponding to the data includes an end-of-block code; and when a decoded-word selected and output from the code table has an end-of-block code, the decoding of the block data string is stopped.

22. A variable-length-code decoding method according to claim 19, wherein video data is divided into a plurality of blocks each of which is orthogonally transformed and quantized to generate a data block, and the data block is variable-length coded;

the decoded-word of the variable-length code represents data of a corresponding one of the data blocks by a runlength of successive zeros and a data value other than the successive zeros, and when the data block has successive zeros continued from certain data to an end of the data block, a word corresponding to the data includes an end-of-block code;

when a decoded-word selected and output from the code table has an end-of-block code, the decoding of the data block is stopped at the word; and when the end-of-block code is written at an address in the memory, the data which is currently held by the memory is output from the starting address to an address corresponding to the end of the data block in the memory.

* * * * *

UNITED STATES PATENT AND TRADE MARK OFFICE
CERTIFICATE OF CORRECTION

PATENT NO. : 5,625,355
DATED : April 29, 1997
INVENTOR(S) : Takeno et al.

It is certified that error appears in the above-identified patent and that said Letters Patent is hereby corrected as shown below:

Column 14, line 7, "processing" should begin a new paragraph.

Column 14, line 17, after "codeword" delete "a".

Column 16, line 37, after "coded/decoded" delete "a".

Signed and Sealed this

Twenty-fourth Day of February, 1998

*Attest:*

BRUCE LEHMAN

*Attesting Officer*  *Commissioner of Patents and Trademarks*